United States Patent
Matsuda et al.

(10) Patent No.: US 10,652,071 B2
(45) Date of Patent: May 12, 2020

(54) SYMBOL MAPPING DEVICE

(71) Applicant: Mitsubishi Electric Corporation, Tokyo (JP)

(72) Inventors: Keisuke Matsuda, Tokyo (JP); Keisuke Dohi, Tokyo (JP); Tsuyoshi Yoshida, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/486,127

(22) PCT Filed: Mar. 22, 2017

(86) PCT No.: PCT/JP2017/011534
§ 371 (c)(1),
(2) Date: Aug. 14, 2019

(87) PCT Pub. No.: WO2018/173168
PCT Pub. Date: Sep. 27, 2018

(65) Prior Publication Data
US 2020/0067756 A1 Feb. 27, 2020

(51) Int. Cl.
*H04L 27/34* (2006.01)
*H04L 1/00* (2006.01)

(52) U.S. Cl.
CPC ............ *H04L 27/34* (2013.01); *H04L 1/0003* (2013.01); *H04L 1/0041* (2013.01); *H04L 1/0057* (2013.01); *H04L 1/0071* (2013.01)

(58) Field of Classification Search
CPC ..... H04L 27/34; H04L 1/0003; H04L 1/0041; H04L 1/0057; H04L 1/0071
See application file for complete search history.

(56) References Cited

U.S. PATENT DOCUMENTS 5,349,384 A * 9/1994 Oguro .................... H04N 5/935
375/240.03
5,844,918 A * 12/1998 Kato .................... H03M 13/03
714/751

(Continued)

FOREIGN PATENT DOCUMENTS

EP 2 506 458 A1 10/2012
JP 2008-271312 A 11/2008
WO WO 2010/137507 A1 12/2010

OTHER PUBLICATIONS

International Search Report for PCT/JP2017/011534 (PCT/ISA/210) dated Jun. 20, 2017.

(Continued)

*Primary Examiner* — Jaison Joseph
(74) *Attorney, Agent, or Firm* — Birch, Stewart, Kolasch & Birch, LLP

(57) ABSTRACT

A symbol mapping device includes a transmission data processing unit receiving two transmission data having the same length, and if the length is a first length, uses the two transmission data as two output data without change, and if the length is less than the first length, adds dummy data to the two transmission data to generate two output data, each data having the first length; a parity addition unit generating two parity-added transmission data based on the two output data, where the two parity-added transmission data each contain parity data added to the transmission data and each have a second length; a shuffle unit extracting two modulation data, being data to be mapped, from the two parity-added transmission data generated by the parity addition unit; and a mapping processing unit mapping the two modulation data to two time slots of constellation points.

5 Claims, 10 Drawing Sheets

(56) References Cited

U.S. PATENT DOCUMENTS

| | | | | |
|---|---|---|---|---|
| 6,308,296 B1* | 10/2001 | Sasaki | ................ | H04N 1/00326 |
| | | | | 386/E5.061 |
| 6,335,841 B1* | 1/2002 | Hirano | ............... | G11B 20/1833 |
| | | | | 341/50 |
| 2008/0016430 A1* | 1/2008 | Yoshida | .............. | G06F 11/1068 |
| | | | | 714/764 |
| 2012/0240005 A1* | 9/2012 | Choi | ...................... | H04H 20/30 |
| | | | | 714/755 |
| 2013/0091398 A1 | 4/2013 | Djordjevic et al. | | |
| 2015/0092879 A1 | 4/2015 | Mansour et al. | | |
| 2016/0127166 A1* | 5/2016 | Zhang | ................. | H04L 27/367 |
| | | | | 398/185 |
| 2019/0377633 A1* | 12/2019 | Perlmutter | .......... | G06F 11/1068 |

OTHER PUBLICATIONS

Kojima et al., "Constant modulus 4D optimized constellation alternative for DP-8QAM", Proc. ECOC, P.3.25, (2014), pp. 1-3.
Extended European Search Report issued in corresponding European Patent Application No. 17901814.8 dated Jan. 30, 2020.

* cited by examiner

FIG.1

| # | NUMBER OF BITS OF TRANSMISSION DATA OF ONE TIME SLOT | NUMBER OF BITS OF LUT INPUT | NUMBER OF BITS OF PARITY DATA | NUMBER OF BITS OF LUT OUTPUT (DATA FOR MODULATION) |
|---|---|---|---|---|
| 1 | 2 BITS | 4 BITS (TWO TIME SLOTS) | 4 BITS (TWO TIME SLOTS) | 8 BITS (TWO TIME SLOTS) |
| 2 | 3 BITS | 6 BITS (TWO TIME SLOTS) | 2 BITS (TWO TIME SLOTS) | 8 BITS (TWO TIME SLOTS) |
| 3 | 5 BITS | 5 BITS (ONE TIME SLOT) | 3 BITS (ONE TIME SLOT) | 8 BITS (ONE TIME SLOT) |
| 4 | 6 BITS | 6 BITS (ONE TIME SLOT) | 2 BITS (ONE TIME SLOT) | 8 BITS (ONE TIME SLOT) |
| 5 | 7 BITS | 7 BITS (ONE TIME SLOT) | 1 BITS (ONE TIME SLOT) | 8 BITS (ONE TIME SLOT) |

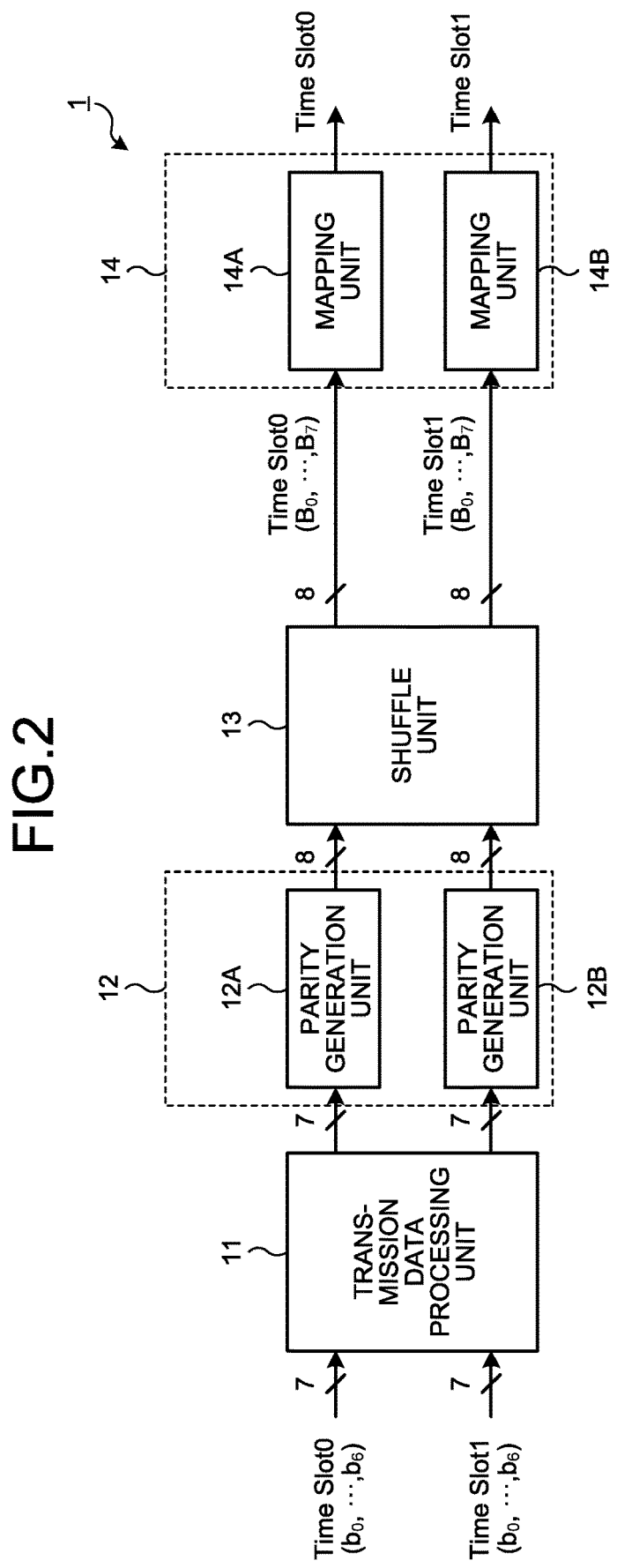

| OUTPUT | MODE | | |
|---|---|---|---|
| | 1 | 2 | 3 |
| $b_{00OUT}$ | $b_{00IN}$ | $b_{00IN}$ | $b_{00IN}$ |
| $b_{01OUT}$ | $b_{01IN}$ | $b_{01IN}$ | $b_{01IN}$ |
| $b_{02OUT}$ | $b_{02IN}$ | $b_{10IN}$ | $b_{02IN}$ |
| $b_{03OUT}$ | $b_{03IN}$ | $b_{11IN}$ | $b_{10IN}$ |
| $b_{04OUT}$ | $b_{04IN}$ | 0 | $b_{11IN}$ |
| $b_{05OUT}$ | $b_{05IN}$ | 0 | $b_{12IN}$ |
| $b_{06OUT}$ | $b_{06IN}$ | 0 | 0 |
| $b_{10OUT}$ | $b_{10IN}$ | $b_{00IN}$ | $b_{00IN}$ |
| $b_{11OUT}$ | $b_{11IN}$ | $b_{01IN}$ | $b_{01IN}$ |
| $b_{12OUT}$ | $b_{12IN}$ | $b_{10IN}$ | $b_{02IN}$ |
| $b_{13OUT}$ | $b_{13IN}$ | $b_{11IN}$ | $b_{10IN}$ |
| $b_{14OUT}$ | $b_{14IN}$ | 0 | $b_{11IN}$ |
| $b_{15OUT}$ | $b_{15IN}$ | 0 | $b_{12IN}$ |
| $b_{16OUT}$ | $b_{16IN}$ | 0 | 0 |

| OUTPUT | MODE | | |
|---|---|---|---|
| | 1 | 2 | 3 |
| $B_{00OUT}$ | $B_{00IN}$ | $B_{00IN}$ | $B_{00IN}$ |
| $B_{01OUT}$ | $B_{01IN}$ | $B_{01IN}$ | $B_{01IN}$ |
| $B_{02OUT}$ | $B_{02IN}$ | $B_{02IN}$ | $B_{02IN}$ |
| $B_{03OUT}$ | $B_{03IN}$ | $B_{03IN}$ | $B_{03IN}$ |
| $B_{04OUT}$ | $B_{04IN}$ | 0 | 0 |
| $B_{05OUT}$ | $B_{05IN}$ | 0 | 0 |
| $B_{06OUT}$ | $B_{06IN}$ | 0 | 0 |
| $B_{07OUT}$ | $B_{07IN}$ | 0 | 0 |
| $B_{10OUT}$ | $B_{10IN}$ | $B_{05IN}$ | $B_{04IN}$ |
| $B_{11OUT}$ | $B_{11IN}$ | $B_{06IN}$ | $B_{05IN}$ |
| $B_{12OUT}$ | $B_{12IN}$ | $B_{15IN}$ | $B_{06IN}$ |
| $B_{13OUT}$ | $B_{13IN}$ | $B_{16IN}$ | $B_{16IN}$ |
| $B_{14OUT}$ | $B_{14IN}$ | 0 | 0 |
| $B_{15OUT}$ | $B_{15IN}$ | 0 | 0 |
| $B_{16OUT}$ | $B_{16IN}$ | 0 | 0 |
| $B_{17OUT}$ | $B_{17IN}$ | 0 | 0 |

| OUTPUT | MODE | | |
|---|---|---|---|
| | 1 | 2 | 3 |
| $B_{00OUT}$ | $B_{00IN}$ | $B_{00IN}$ | $B_{00IN}$ |
| $B_{01OUT}$ | $B_{01IN}$ | $B_{01IN}$ | $B_{01IN}$ |
| $B_{02OUT}$ | $B_{02IN}$ | $B_{02IN}$ | $B_{02IN}$ |
| $B_{03OUT}$ | $B_{03IN}$ | $B_{03IN}$ | $B_{03IN}$ |
| $B_{04OUT}$ | $B_{04IN}$ | 0 | 0 |
| $B_{05OUT}$ | $B_{05IN}$ | 0 | 0 |
| $B_{06OUT}$ | $B_{06IN}$ | 0 | 0 |
| $B_{07OUT}$ | $\sim B_{06IN}$ | 0 | 0 |
| $B_{10OUT}$ | $B_{10IN}$ | $B_{05IN}$ | $B_{04IN}$ |
| $B_{11OUT}$ | $B_{11IN}$ | $B_{06IN}$ | $B_{05IN}$ |
| $B_{12OUT}$ | $B_{12IN}$ | $B_{15IN}$ | $B_{06IN}$ |
| $B_{13OUT}$ | $B_{13IN}$ | $B_{16IN}$ | $B_{16IN}$ |
| $B_{14OUT}$ | $B_{14IN}$ | 0 | 0 |
| $B_{15OUT}$ | $B_{15IN}$ | 0 | 0 |
| $B_{16OUT}$ | $B_{16IN}$ | 0 | 0 |
| $B_{17OUT}$ | $\sim B_{16IN}$ | 0 | 0 |

SYMBOL MAPPING DEVICE

FIELD

The present invention relates to a symbol mapping device applicable to an optical communication system.

BACKGROUND

To implement an optimum modulation scheme for system requirements in an optical communication system, multi-dimensional modulation techniques have been proposed which allow a spectral efficiency to be selected with a finer granularity, in addition to conventional dual polarization quadrature amplitude modulation (QAM) techniques. A conventional dual polarization QAM maps transmission data to a constellation point independently in a two-dimensional space of each of the polarized waves. In contrast, multi-dimensional modulation maps transmission data to a constellation point in a four- or higher-dimensional space formed of two polarized waves and of multiple time slots (TSs). Thus, multi-dimensional modulation can use an increased Euclidean distance between constellation points, and thus can increase noise tolerance. Multi-dimensional modulation can also increase nonlinearity tolerance by reducing signal power variations in each TS and/or increasing the level of randomness in a polarized state (see Non-Patent Literature 1). Note that mapping over n TSs is performed such that data is mapped to constellation points in a 4n-dimensional space.

Typically, in symbol mapping in multi-dimensional modulation, parity data is added to the transmission data, which is then rearranged to form data to be modulated (hereinafter referred to simply as "modulation data"), and the modulation data is mapped to constellation points of a QAM scheme or to constellation points of a 2-ary amplitude 8-ary phase shift keying (2A8PSK) scheme. Transmission data is converted to modulation data using a circuit including a look-up table (LUT) or the like or using a dedicated symbol mapping circuit applicable only to a specific multi-dimensional modulation scheme (see Patent Literature 1).

CITATION LIST

Patent Literature

Patent Literature 1: European Patent Application Publication No. 2506458

Non-Patent Literature

Non-Patent Literature 1: K. Kojima, et al., "Constant modulus 4D optimized constellation alternative for DP-8QAM", Proc. ECOC, P. 3.25 (2014).

SUMMARY

Technical Problem

In a circuit configuration that uses an LUT to convert transmission data into modulation data, use of a rewritable LUT enables multiple types of multi-dimensional modulations that each provide a different spectral efficiency to be implemented in one application specific integrated circuit (ASIC). However, the configuration using a rewritable LUT raises a problem in that the circuit size increases.

By way of example, consider a circuit that converts transmission data into modulation data using an LUT is capable of performing multi-dimensional modulation on any transmission data that is two-bit, three-bit, five-bit, six-bit, or seven-bit transmission data. In this case, input and output of the LUT may or may not use as many as two TSs. The case in which input and output of the LUT use as many as two TSs is a case in which two TSs of transmission data are together input to the LUT and two TSs of transmission data, generated by addition of parity data, is then output. This is the case for transmission data having a length of two bits or three bits. The case in which input and output of the LUT do not use as many as two TSs is a case in which one TS of transmission data is input to the LUT and one TS of transmission data, generated by addition of parity data, is then output. This is the case for transmission data having a length of five bits or more. The possibility that input and output of the LUT may or may not use as many as two TSs requires two types of LUTs to support both cases. Specifically, in a case in which input and output use as many as two TSs, one six-bit input and eight-bit output LUT is required per two TSs; and in a case in which input and output do not use as many as two TSs, one seven-bit input and eight-bit output LUT is required for each of two TSs. That is, a total of three LUTs are required, thereby increasing the circuit size.

Note that if transmission data that is input to each LUT has a bit width less than the input bit width of the corresponding LUT, the transmission data as well as dummy data are input to each LUT. For example, when two-bit transmission data is input to a six-bit input and eight-bit output LUT for each of two TSs, a total of four bits of transmission data for two TSs and two bits of dummy data are input to the LUT, and the LUT generates four bits of parity data on the basis of the four bits of transmission data.

The present invention has been made in view of the foregoing, and it is an object of the present invention to provide a symbol mapping device that provides multiple types of multi-dimensional modulations each providing a different spectral efficiency and is also capable of reducing the size of the circuit.

Solution to Problem

To solve the problem and achieve the object described above, a symbol mapping device according to an aspect of the present invention includes: a transmission data processing unit to receive two pieces of transmission data having a same length, and in a case in which the length is a first length, to use the two pieces of transmission data as two pieces of output data without change, and in a case in which the length is less than the first length, to add dummy data to the two pieces of transmission data to generate two pieces of output data, each piece having the first length; and a parity addition unit to generate two pieces of parity-added transmission data on a basis of the two pieces of output data, the two pieces of parity-added transmission data each containing parity data added to the transmission data and each having a second length. The symbol mapping device further includes: a modulation data extraction unit to extract two pieces of modulation data, being data to be mapped, from the two pieces of parity-added transmission data generated by the parity addition unit; and a mapping processing unit to map the two pieces of modulation data to two time slots of constellation points.

Advantageous Effects of Invention

According to the present invention, an advantage is provided in that a symbol mapping device can be provided that provides multiple types of multi-dimensional modulations each providing a different spectral efficiency and is also capable of reducing the size of the circuit.

BRIEF DESCRIPTION OF DRAWINGS

FIG. 1 is a diagram illustrating an example specification for implementing multiple types of multi-dimensional modulations each providing a different spectral efficiency using a look-up table.

FIG. 2 is a diagram illustrating an example configuration of a symbol mapping device according to a first embodiment.

DESCRIPTION OF EMBODIMENTS

Figure 3:
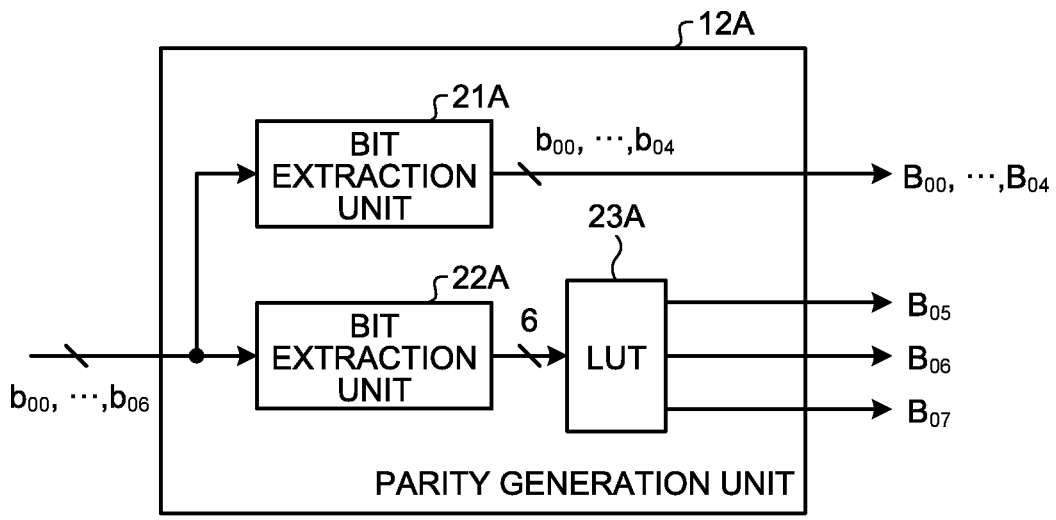
FIG. 3 is a diagram illustrating an example configuration of a first parity generation unit according to the first embodiment.

A symbol mapping device according to embodiments of the present invention will be described in detail below with reference to the drawings. Note that these embodiments are not intended to limit the scope of this invention.

The embodiments described below each assume, as an example, that the symbol mapping device is configured to be capable of sending any transmission data that is two-bit, three-bit, five-bit, six-bit, or seven-bit transmission data per time slot (hereinafter, TS).

FIG. 1 is a diagram illustrating an example specification of a look-up table (hereinafter, LUT) in a case in which multiple types of multi-dimensional modulations each providing a different spectral efficiency, i.e., a different number of bits of transmission data per TS, is implemented using an LUT. The phrase "the number of bits of transmission data of one time slot" refers to the number of bits of transmission data per TS. The phrase "the number of bits of an LUT input" refers to the number of bits of transmission data input to a single LUT. For example, if "the number of bits of transmission data of one time slot" is two bits, four-bit transmission data corresponding to two TSs is input to a single LUT; and if "the number of bits of transmission data of one time slot" is five bits, five-bit transmission data corresponding to one TS is input to a single LUT.

In the example illustrated in FIG. 1, multi-dimensional modulation that sends two bits or three bits of data per TS maps the modulation data to two consecutive TSs along the time axis, i.e., to an eight-dimensional space, while multi-dimensional modulation that sends five bits, six bits, or seven bits of data per TS maps the modulation data to one TS, i.e., to a four-dimensional space.

The multi-dimensional modulation that sends two bits or three bits of data per TS maps the modulation data to constellation points of dual polarization-quadrature phase shift keying, which can map four bits of data per TS. Thus, two bits of parity data is needed per TS for sending two bits of data per TS, and one bit of parity data is needed per TS for sending three bits of data per TS.

In addition, it is assumed herein that the multi-dimensional modulation that sends five bits, six bits, or seven bits of data per TS maps the modulation data to constellation points of 2A8PSK, which can map eight bits of data per TS. Thus, three bits of parity data is needed per TS for sending five bits of data per TS; two bits of parity data is needed per TS for sending six bits of data per TS; and one bit of parity data is needed per TS for sending seven bits of data per TS.

First Embodiment

FIG. 2 is a diagram illustrating an example configuration of a symbol mapping device according to a first embodiment of the present invention. A symbol mapping device 1 according to the first embodiment includes a transmission data processing unit 11, parity generation units 12A and 12B, a shuffle unit 13, and mapping units 14A and 14B. The parity generation units 12A and 12B together form a parity addition unit 12, and the mapping units 14A and 14B together form a mapping processing unit 14. Note that when a distinction is necessary between two consecutive TSs along the time axis, these TSs are referred to as a first TS and a second TS in the description given below.

The symbol mapping device 1 illustrated in FIG. 2 adds parity data to each of data to be sent in the first TS, i.e., "Time Slot 0", and data to be sent in the second TS, i.e., "Time Slot 1", and then maps the resultant data to constellation points of a modulation scheme associated with the number of bits of the data to be sent in each TS.

The transmission data processing unit 11 of the symbol mapping device 1 receives two pieces, i.e., two lines, of transmission data to be sent respectively using the first TS and the second TS. Specifically, as illustrated in FIG. 2, transmission data $b_0, \ldots,$ and $b_6$ associated with "Time Slot 0" and transmission data $b_0, \ldots,$ and $b_6$ associated with "Time Slot 1" are input to the transmission data processing unit 11. Note that each line of transmission data has a length, i.e., the number of bits, equivalent to the number of bits to be sent per TS. That is, in a case in which the number of bits to be sent per TS is two bits, two bits per line, that is, a total of four bits, of transmission data are input to the transmission data processing unit 11.

The transmission data processing unit 11 performs a transmission data length adjustment process, described later herein, on the two lines of transmission data input, and generates two lines of output data each having a length of a first length. The two lines of output data generated by the transmission data processing unit 11 are input data respectively input to the parity generation units 12A and 12B. The first length is herein assumed to be seven bits. As will be described in detail below, the two lines of seven-bit output data output from the transmission data processing unit 11 may each contain dummy data to adjust the length thereof to seven bits.

FIG. 3 is a diagram illustrating an example configuration of the parity generation unit 12A, which is a first parity generation unit of the symbol mapping device 1 according to the first embodiment. As illustrated in FIG. 3, the parity generation unit 12A includes bit extraction units 21A and 22A, and a look-up table circuit (LUT) 23A, which generates parity data. The parity generation unit 12A generates eight bits, i.e., a second length, of parity-added transmission data $B_{00}, \ldots,$ and $B_{07}$, containing parity data added to the transmission data, on the basis of the seven bits of data $b_{00}, \ldots,$ and $b_{06}$ input from the transmission data processing unit 11.

The bit extraction unit 21A, i.e., a first bit extraction unit of the parity generation unit 12A, extracts the five most significant bits $b_{00}, \ldots,$ and $b_{04}$ from the seven bits of data input from the transmission data processing unit 11, and outputs the bits $b_{00}, \ldots,$ and $b_{04}$ to the shuffle unit 13 as bits $B_{00}, \ldots,$ and $B_{04}$. That is, the bit extraction unit 21A is the first bit extraction unit that extracts a first number of bits of data from the output data of the transmission data processing unit 11, where the first number is less than the number of bits of the output data, and outputs the extracted data as part of the parity-added transmission data. The five bits of data output by the bit extraction unit 21A is part or all of the transmission data contained in the output data of the transmission data processing unit 11.

The bit extraction unit 22A, i.e., a second bit extraction unit of the parity generation unit 12A, extracts six bits from the seven bits of data input from the transmission data processing unit 11, and outputs these six bits to the LUT 23A. That is, the bit extraction unit 22A is the second bit extraction unit that extracts a second number of bits of data from the output data of the transmission data processing unit 11, where the second number is less than the number of bits of the output data. It is assumed herein that the six bits to be extracted from the seven bits of data by the bit extraction unit 22A is predetermined depending on the number of bits of data to be sent in one TS. Correspondence between the six bits to be extracted by the bit extraction unit 22A and the number of bits of data to be sent in one TS will be described later herein.

The LUT 23A of the parity generation unit 12A generates parity data having a length up to three bits on the basis of the six bits of data input from the bit extraction unit 22A. The number of bits of the parity data generated by the LUT 23A differs depending on the number of bits of the transmission data per TS. As will be described in detail below, the LUT 23A generates two bits of parity data in a case in which the transmission data has a length of two bits per TS, and generates one bit of parity data in a case in which the transmission data has a length of three bits per TS. Alternatively, the LUT 23A generates three bits of parity data in a case in which the transmission data has a length of five bits per TS, generates two bits of parity data in a case in which the transmission data has a length of six bits per TS, and generates one bit of parity data in a case in which the transmission data has a length of seven bits per TS. In a case of generation of the parity data having a length of two bits or less, the remaining bit or bits other than the parity data, of the three bits of data output by the LUT 23A, will be transmission data or dummy data. The three bits of data generated and output by the LUT 23A is the remaining three bits of the parity-added transmission data other than the five bits of the parity-added transmission data output by the bit extraction unit 21A described above, of a total of eight bits of the parity-added transmission data generated by the parity generation unit 12A. The parity data may be generated in any manner. By way of example, when three bits of parity data is to be generated, the LUT 23A divides the six bits input into three groups each containing two bits, and performs an exclusive OR (XOR) operation on each pair of two bits to generate parity data. By way of specific example, the LUT 23A performs an XOR operation on the most and second most significant bits, an XOR operation on the third and fourth most significant bits, and an XOR operation on the fifth and sixth most significant bits, of the six bits input, to obtain the three bits of parity data. In this case, the LUT 23A outputs the three bits of parity data generated, as bits $B_{05}, B_{06},$ and $B_{07}$. The operations of the LUT 23A in the case in which the LUT 23A generates two bits of parity data and in the case in which the LUT 23A generates one bit of parity data will be described later herein. It is assumed herein that the configuration, i.e., the processing to be performed, of the LUT 23A is rewritable from outside the symbol mapping device 1.

Figure 4:
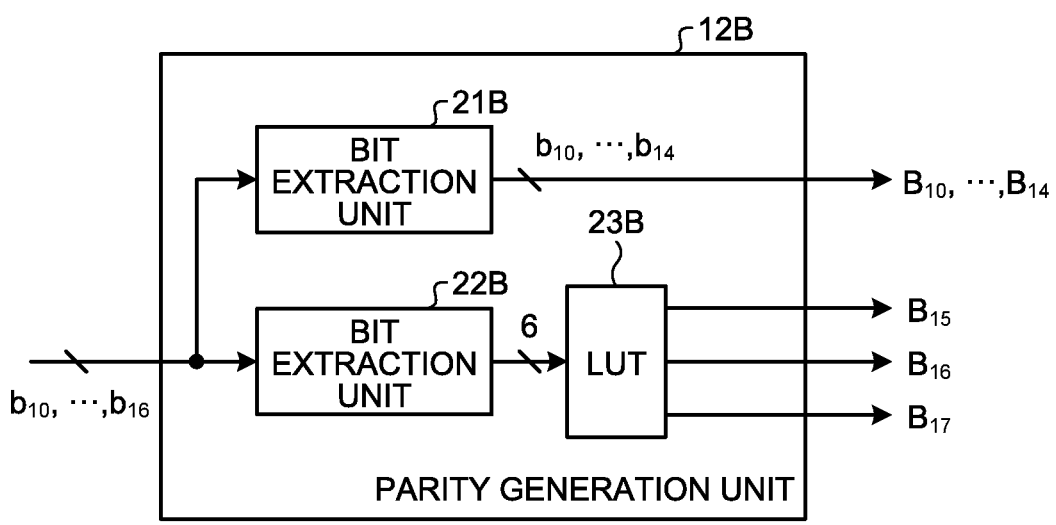
FIG. 4 is a diagram illustrating an example configuration of a second parity generation unit according to the first embodiment.

FIG. 4 is a diagram illustrating an example configuration of the parity generation unit 12B, which is a second parity generation unit of the symbol mapping device 1 according to the first embodiment. As illustrated in FIG. 4, the parity generation unit 12B includes bit extraction units 21B and 22B, and a look-up table circuit (LUT) 23B, which generates parity data. The parity generation unit 12B generates eight bits of parity-added transmission data $B_{10}, \ldots,$ and $B_{17}$, containing parity data added to the transmission data, on the basis of the seven bits of data $b_{10}, \ldots,$ and $b_{16}$ input from the transmission data processing unit 11.

The bit extraction unit 21B, i.e., a first bit extraction unit of the parity generation unit 12B, extracts the five most significant bits $b_{10}, \ldots,$ and $b_{14}$ from the seven bits of data input from the transmission data processing unit 11, and outputs the bits $b_{10}, \ldots,$ and $b_{14}$ to the shuffle unit 13 as bits $B_{10}, \ldots,$ and $B_{14}$.

The bit extraction unit 22B, i.e., a second bit extraction unit of the parity generation unit 12B, extracts six bits from the seven bits input from the transmission data processing unit 11, and outputs these six bits to the LUT 23B. The bit extraction unit 22B operates similarly to the bit extraction unit 22A described above.

The LUT 23B of the parity generation unit 12B generates parity data having a length up to three bits on the basis of the six bits of data input from the bit extraction unit 22B. The number of bits of the parity data generated by the LUT 23B differs depending on the number of bits of the transmission data per TS. The LUT 23B operates similarly to the LUT 23A described above. It is assumed herein that the configuration, i.e., the processing to be performed, of the LUT 23B is rewritable from outside the symbol mapping device 1.

The shuffle unit 13 of the symbol mapping device 1 is a modulation data extraction unit. The shuffle unit 13 performs a shuffling process, described later, on the parity-added transmission data output from the parity generation unit 12A and on the parity-added transmission data output from the parity generation unit 12B, and extracts modulation data to be input to the mapping unit 14A and modulation data to be input to the mapping unit 14B.

The mapping unit 14A, which is a first mapping unit, and the mapping unit 14B, which is a second mapping unit, of the symbol mapping device 1 each map a valid bit contained in the modulation data input from the shuffle unit 13 to a constellation point of the modulation scheme associated with the number of valid bits. The phrase "valid bit contained in the modulation data" refers to a bit included in the transmission data or in the parity data. The modulation data contains four bits or eight bits of valid bits. The mapping unit 14A maps the modulation data to constellation points of the first TS, and the mapping unit 14B maps the modulation data to constellation points of the second TS.

Figures 5, 6:
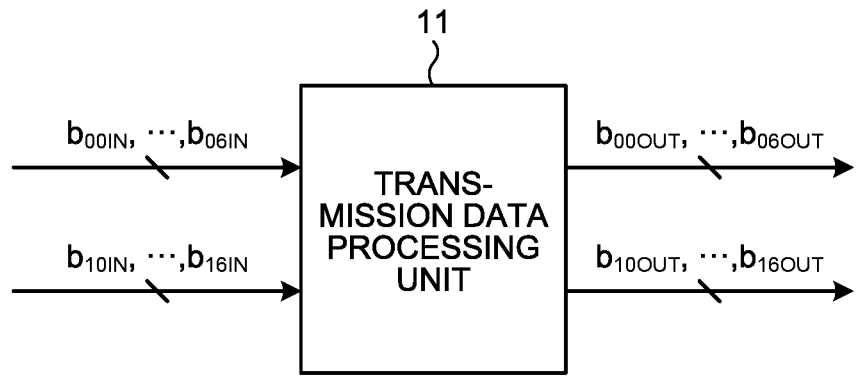
FIG. 5 is a diagram illustrating definitions of input signals and output signals to and from a transmission data processing unit according to the first embodiment.
FIG. 6 is a diagram illustrating an example of transmission data length adjustment process performed by the transmission data processing unit according to the first embodiment.

A transmission data length adjustment process performed by the transmission data processing unit 11 will next be described. FIG. 5 is a diagram illustrating definitions of input signals to the transmission data processing unit 11 and of output signals of the transmission data processing unit 11. FIG. 6 is a diagram illustrating an example of the transmission data length adjustment process performed by the transmission data processing unit 11.

As illustrated in FIG. 5, the transmission data processing unit 11 receives two lines of transmission data $b_{00IN}, \ldots,$ and $b_{06IN}$; and $b_{10IN}, \ldots,$ and $b_{16IN}$. The bits $b_{00IN}, \ldots,$ and $b_{06IN}$ respectively correspond to the bits $b_0, \ldots,$ and $b_6$ of TS0 (Time Slot 0) illustrated in FIG. 2, and the bits $b_{10IN}, \ldots,$ and $b_{16IN}$ respectively correspond to the bits $b_0, \ldots,$ and $b_6$ of TS1 (Time Slot 1) illustrated in FIG. 2. In addition, the transmission data processing unit 11 outputs two lines of reproduced data $b_{00OUT}, \ldots,$ and $b_{06OUT}$; and $b_{10OUT}, \ldots,$ and $b_{16OUT}$, which are results of performing of the transmission data length adjustment process.

As illustrated in FIG. 6, the transmission data processing unit 11 has three operation modes, and operates in a mode associated with the number of bits of data to be sent in one TS. It is assumed here that input data and output data per TS to and from the transmission data processing unit 11 have a bit width of seven bits. In a case in which the required number of bits is less than seven bits, that is, in a case in which the number of bits of data to be sent in one TS is less than seven bits, the transmission data processing unit 11 stores that data in the most significant bit positions. The remaining bit position(s) is or are filled with, for example, '0' or '0's, or given data as dummy data. FIG. 6 illustrates an example of filling the remaining bit position(s) with '0' or '0's as the dummy data.

Mode 1 illustrated in FIG. 6 is an operation mode selected by the transmission data processing unit 11 in a case in which data having a length of five to seven bits is to be sent in one TS. In Mode 1, the transmission data processing unit 11 outputs the bits $b_{00IN}, \ldots,$ and $b_{06IN}$ that have been input as the data to be sent in the first TS respectively as the bits $b_{00OUT}, \ldots,$ and $b_{06OUT}$ without change, and outputs the bits $b_{10IN}, \ldots,$ and $b_{16IN}$ that have been input as the data to be sent in the second TS respectively as the bits $b_{10OUT}, \ldots,$ and $b_{16OUT}$ without change. Note that the bits $b_{00OUT}, \ldots,$ and $b_{06OUT}$, and the bits $b_{10OUT}, \ldots,$ and $b_{16OUT}$ respectively correspond to the bits $b_{00}, \ldots,$ and $b_{06}$ illustrated in FIG. 3, and the bits $b_{10}, \ldots,$ and $b_{16}$ illustrated in FIG. 4.

Mode 2 illustrated in FIG. 6 is an operation mode selected by the transmission data processing unit 11 in a case in which data having a length of two bits is to be sent in one TS. In Mode 2, the transmission data processing unit 11 outputs the bit $b_{00IN}$ that has been input as data to be sent in the first TS, as the bits $b_{00OUT}$ and $b_{10OUT}$, and outputs the bit $b_{01IN}$ as the bits $b_{01OUT}$ and $b_{11OUT}$. The transmission data processing unit 11 also outputs the bit $b_{10IN}$ that has been input as data to be sent in the second TS, as the bits $b_{02OUT}$ and $b_{12OUT}$, and also outputs the bit $b_{11IN}$ as the bits $b_{03OUT}$ and $b_{13OUT}$. The transmission data processing unit 11 further outputs '0's as the bits $b_{04OUT}, \ldots,$ and $b_{06OUT}$, and as the bits $b_{14OUT}, \ldots,$ and $b_{16OUT}$. That is, in Mode 2, the transmission data processing unit 11 combines together the input data to be sent in the first TS and the input data to be sent in the second TS, adds three bits of dummy data to the four bits of combined data, and then outputs the resultant data to the parity generation unit 12A and to the parity generation unit 12B.

Mode 3 illustrated in FIG. 6 is an operation mode selected by the transmission data processing unit 11 in a case in which data having a length of three bits is to be sent in one TS. In Mode 3, the transmission data processing unit 11 outputs the bit $b_{00IN}$ that has been input as data to be sent in the first TS, as the bits $b_{00OUT}$ and $b_{10OUT}$, outputs the bit $b_{01IN}$ as the bits $b_{01OUT}$ and $b_{11OUT}$, and outputs the bit $b_{02IN}$ as the bits $b_{02OUT}$ and $b_{12OUT}$. The transmission data processing unit 11 also outputs the bit $b_{10IN}$ that has been input as data to be sent in the second TS, as the bits $b_{03OUT}$ and $b_{13OUT}$, outputs the bit $b_{11IN}$ as the bits $b_{04OUT}$ and $b_{14OUT}$, and outputs the bit $b_{12IN}$ as the bits $b_{05OUT}$ and $b_{15OUT}$. The transmission data processing unit 11 further outputs '0's as the bits $b_{06OUT}$ and $b_{16OUT}$. That is, in Mode 3, the transmission data processing unit 11 combines together the input data to be sent in the first TS and the input data to be sent in the second TS, add one bit of dummy data to the six bits of combined data, and then outputs the resultant data to the parity generation unit 12A and to the parity generation unit 12B.

As described above, upon reception of two lines of transmission data having the same length where each line of the transmission data has a length of the first length, i.e., seven bits, the transmission data processing unit 11 uses the two lines of transmission data input, as the two pieces of output data respectively to the two parity generation units 12A and 12B. In a case in which each line of the transmission data input has a length less than the first length, the transmission data processing unit 11 adds dummy data to the two lines of transmission data input, to generate two pieces of first-length data, and uses these two pieces of first-length data as the two pieces of output data respectively to the two parity generation units 12A and 12B. In the case of addition of dummy data to the two lines of transmission data input to generate the two pieces of first-length output data, the transmission data processing unit 11 combines together the two lines of transmission data, and adds the dummy data thereto to adjust the length to the first length.

Figures 7, 8:
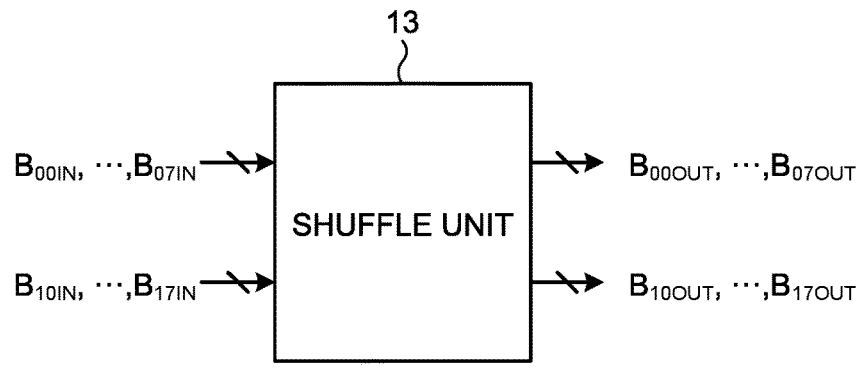
FIG. 7 is a diagram illustrating definitions of input signals and output signals to and from a shuffle unit according to the first embodiment.
FIG. 8 is a diagram illustrating an example of shuffling process performed by the shuffle unit according to the first embodiment.

A shuffling process performed by the shuffle unit 13 will next be described. FIG. 7 is a diagram illustrating definitions of input signals to the shuffle unit 13 and of output signals of the shuffle unit 13. FIG. 8 is a diagram illustrating an example of shuffling process performed by the shuffle unit 13.

As illustrated in FIG. 7, the shuffle unit 13 receives a total of 16 bits of parity-added transmission data $B_{00IN}$, and $B_{07IN}$, and $B_{10IN}$, . . . , and $B_{17IN}$ from the parity generation units 12A and 12B. The bits $B_{00IN}$, . . . , and $B_{07IN}$, and the bits $B_{10IN}$, . . . , and $B_{17IN}$ respectively correspond to the bits $B_{00}$, . . . , and $B_{07}$ illustrated in FIG. 3, and the bits $B_{10}$, . . . , and $B_{17}$ illustrated in FIG. 4.

Similarly to the transmission data processing unit 11 described above, the shuffle unit 13 also has three operation modes, and operates in a mode associated with the number of bits of data to be sent in one TS. It is assumed here that input data and output data per TS to and from the shuffle unit 13 have a bit width of eight bits. In a case in which the required number of bits is less than eight bits, that is, in a case in which the number of bits of data to be sent in one TS is less than eight bits, the shuffle unit 13 stores the modulation data in the most significant bit positions. The remaining bit position(s) is or are filled with, for example, '0' or '0's, or given data as dummy data. FIG. 8 illustrates an example of filling the remaining bit positions with '0's as the dummy data.

Mode 1 illustrated in FIG. 8 is an operation mode selected by the shuffle unit 13 in a case in which data having a length of five to seven bits is to be sent in one TS. In Mode 1, the shuffle unit 13 outputs the input bits $B_{00IN}$, . . . , and $B_{07IN}$ respectively as the modulation data $B_{00OUT}$, . . . , and $B_{07OUT}$ without change, and outputs the input bits $B_{10IN}$, . . . , and $B_{17IN}$ respectively as the modulation data $B_{10OUT}$, . . . , and $B_{17OUT}$ without change. In this case, the bits $B_{00OUT}$, . . . , and $B_{07OUT}$ output by the shuffle unit 13 are mapped to constellation points by the mapping unit 14A, and the bits $B_{10OUT}$, . . . , and $B_{17OUT}$ are mapped to constellation points by the mapping unit 14B. Note that the bits $B_{00OUT}$, . . . , and $B_{07OUT}$ respectively correspond to the bits $B_0$, . . . , and $B_7$ of TS0 (Time Slot 0) illustrated in FIG. 2, and the bits $B_{10OUT}$, . . . , and $B_{17OUT}$ respectively correspond to the bits $B_0$, . . . , and $B_7$ of TS1 (Time Slot 1) illustrated in FIG. 2.

Mode 2 illustrated in FIG. 8 is an operation mode selected by the shuffle unit 13 in a case in which data having a length of two bits is to be sent in one TS. In Mode 2, the shuffle unit 13 outputs the input bits $B_{00IN}$, . . . , and $B_{03IN}$ respectively as the bits $B_{00OUT}$, . . . , and $B_{03OUT}$; outputs the input bits $B_{05IN}$, $B_{06IN}$, $B_{15IN}$, and $B_{16IN}$ respectively as the bits $B_{10OUT}$, . . . , and $B_{13OUT}$; and outputs '0's as the bits $B_{04OUT}$, . . . , and $B_{07OUT}$ and as the bits $B_{14OUT}$, . . . , and $B_{17OUT}$. In this case, the bits $B_{00OUT}$, . . . , and $B_{03OUT}$ output by the shuffle unit 13 are mapped to constellation points by the mapping unit 14A, and the bits $B_{10OUT}$, . . . , and $B_{13OUT}$ are mapped to constellation points by the mapping unit 14B.

Mode 3 illustrated in FIG. 8 is an operation mode selected by the shuffle unit 13 in a case in which data having a length of three bits is to be sent in one TS. In Mode 3, the shuffle unit 13 outputs the input bits $B_{00IN}$, . . . , and $B_{03IN}$ respectively as the bits $B_{00OUT}$, . . . , and $B_{03OUT}$; outputs the input bits $B_{04IN}$, $B_{05IN}$, $B_{06IN}$, and $B_{16IN}$ respectively as the bits $B_{10OUT}$, . . . , and $B_{13OUT}$, and outputs '0's as the bits $B_{04OUT}$, . . . , and $B_{07OUT}$ and as the bits $B_{14OUT}$, . . . , and $B_{17OUT}$. In this case, the bits $B_{00OUT}$, . . . , and $B_{03OUT}$ output by the shuffle unit 13 are mapped to constellation points by the mapping unit 14A, and the bits $B_{10OUT}$, . . . , and $B_{13OUT}$ are mapped to constellation points by the mapping unit 14B.

As described above, the shuffle unit 13 extracts two pieces of modulation data, which are data to be mapped, from the two pieces of parity-added transmission data respectively generated by the two parity generation units 12A and 12B.

A symbol mapping operation performed by the symbol mapping device 1 according to the first embodiment will next be described. As described above, the transmission data processing unit 11 and the shuffle unit 13 of the symbol mapping device 1 each operate in a mode associated with the number of bits of the transmission data per TS. Accordingly, the operation of the symbol mapping device 1 will be described below individually according to the number of bits of the transmission data per TS. Note that it is assumed here that the LUTs 23A and 23B included in the respective parity generation units 12A and 12B of the symbol mapping device 1 each have an internal configuration rewritten in advance on the basis of the number of bits of the transmission data per TS. For purposes of illustration, the transmission data that are input in two lines will hereinafter be described such that one line of data is referred to as odd-numbered line of data and the other line of data is referred to as even-numbered line of data.

Operation for Sending Two Bits of Data Per TS

First, an operation of the symbol mapping device 1 will be described of performing multi-dimensional modulation that sends two bits of data per TS.

When two bits of data of an odd-numbered line and two bits of data of an even-numbered line are input to the symbol mapping device 1, the transmission data processing unit 11 selects and operates in Mode 2 illustrated in FIG. 6. In this case, the transmission data processing unit 11 combines together the two bits of data of the odd-numbered line input and the two bits of data of the even-numbered line input to generate four bits of data. The transmission data processing unit 11 then outputs the four bits of data generated, as odd-numbered and even-numbered lines of data. That is, the transmission data processing unit 11 outputs the same data to both the parity generation units 12A and 12B. This allows the parity generation units 12A and 12B to each calculate the parity data from the two TSs of transmission data.

The bit extraction unit 22A of the parity generation unit 12A extracts, for example, the six most significant bits of data from input data containing a total of four bits of transmission data for two TSs respectively corresponding to the odd-numbered and even-numbered lines, and then outputs these six bits of data to the LUT 23A. The LUT 23A generates two bits of data, of the total of four bits of parity data for two TSs, on the basis of the six bits of data input, and then outputs these two bits of data. Similarly, the bit extraction unit 22B of the parity generation unit 12B extracts, for example, the six most significant bits of data from input data containing a total of four bits of transmission data for two TSs respectively corresponding to the odd-numbered and even-numbered lines, and then outputs these six bits of data to the LUT 23B. The LUT 23B generates two bits of data, of the four bits of parity data for two TSs, on the basis of the six bits of data input. That is, the parity generation units 12A and 12B together generate a total of four bits of parity data for two TSs. Note that the fifth and sixth bits of the data input to each of the parity generation units 12A and 12B are dummy data, and therefore, the LUT 23A and the LUT 23B are each configured such that the output thereof does not depend on the fifth and sixth bits of the input data. That is, the LUT 23A and the LUT 23B are each configured not to use the fifth and sixth bits of the input data in the process of generating the two bits of parity data.

When the parity generation units 12A and 12B generate a total of four bits of parity data for two TSs, the LUT 23A generates, for example, the two most significant bits of the parity data, and the LUT 23A outputs these two bits of data generated, as the two most significant bits of the three-bit output. In addition, the LUT 23B generates the two least significant bits of the parity data, and the LUT 23B outputs these two bits of data generated, as the two most significant bits of the three-bit output. The remaining one bit of the output of each of the LUTs 23A and 23B is dummy data. In this case, the four most significant bits ($B_{00}$, . . . , and $B_{03}$; and $B_{10}$, . . . , and $B_{13}$) of the output of each of the parity generation units 12A and 12B are used to output the transmission data, and the sixth and seventh bits ($B_{05}$, $B_{06}$) of the output of the parity generation unit 12A and the sixth and seventh bits ($B_{15}$, $B_{16}$) of the output of the parity generation unit 12B together constitute the parity data.

The shuffle unit 13 rearranges the four most significant bits ($B_{00}$, . . . , and $B_{03}$) and the sixth and seventh bits ($B_{05}$, $B_{06}$) of the output of the parity generation unit 12A, and the sixth and seventh bits ($B_{15}$, $B_{16}$) of the output of the parity generation unit 12B according to the rule of Mode 2 illustrated in FIG. 8, and then outputs the resultant data as the modulation data. Selection of Mode 2 and operation in Mode 2 allow the shuffle unit 13 to generate four bits of modulation data per TS using the transmission data and the parity data output from the parity generation units 12A and 12B.

Figure 9:
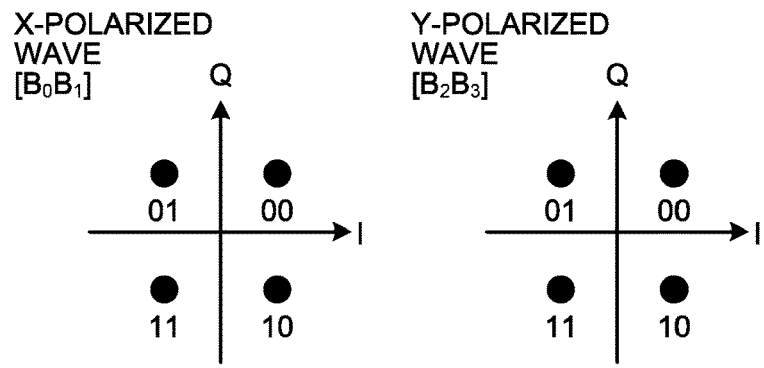
FIG. 9 is a diagram illustrating example relationships between four-bit modulation data processed by a mapping unit according to the first embodiment, and constellation points.

The mapping units 14A and 14B each map the modulation data input from the shuffle unit 13 to, for example, quadrature phase shift keying (QPSK) constellation points illustrated in FIG. 9, and then outputs coordinate sets of the respective constellation points. In the example illustrated in FIG. 9, the mapping unit 14A maps the two most significant bits $B_0$ and $B_1$ to the X-polarized wave of the first TS, and maps the two least significant bits $B_2$ and $B_3$ to the Y-polarized wave. The mapping unit 14B maps the two most significant bits $B_0$ and $B_1$ to the X-polarized wave of the second TS, and maps the two least significant bits $B_2$ and $B_3$ to the Y-polarized wave.

Note that in a case in which two bits of data is sent per TS, the symbol mapping device 1 assigns the total of four bits of transmission data input to the transmission data processing unit 11 to the first TS, and assigns the total of four bits of parity data generated by the parity generation units 12A and 12B to the second TS. The arrangement in assigning the four bits of transmission data and the four bits of parity data depends on the specification of the shuffle unit 13, but the manner of the bit assignment is not limited to the arrangement described above. For example, the shuffle unit 13 may be configured to assign two bits of transmission data and two bits of parity data to each of the first TS and the second TS.

Operation for Sending Three Bits of Data Per TS

An operation of the symbol mapping device 1 will next be described of performing multi-dimensional modulation that sends three bits of data per TS.

When three bits of data of an odd-numbered line and three bits of data of an even-numbered line are input to the symbol mapping device 1, the transmission data processing unit 11 selects and operates in Mode 3 illustrated in FIG. 6. In this case, the transmission data processing unit 11 combines together the three bits of data of the odd-numbered line input and the three bits of data of the even-numbered line input to generate six bits of data. The transmission data processing unit 11 then outputs the six bits of data generated, as odd-numbered and even-numbered lines of data. That is, the transmission data processing unit 11 outputs the same data to both the parity generation units 12A and 12B. This allows the parity generation units 12A and 12B to calculate the parity data from the two TSs of transmission data.

The bit extraction unit 22A of the parity generation unit 12A extracts the six most significant bits of data, which will be six bits of the transmission data for one TS of the odd-numbered line, from the seven-bit input data, and then outputs these six bits of data to the LUT 23A. The LUT 23A generates one bit of data, of the two bits of parity data for two TSs, on the basis of the six bits of data input, and then outputs this one bit of data. Similarly, the bit extraction unit 22B of the parity generation unit 12B extracts the six most significant bits of data, which will be six bits of the transmission data for one TS of the even-numbered line, from the seven-bit input data, and then outputs these six bits of data to the LUT 23B. The LUT 23B generates one bit of data, of the two bits of parity data for two TSs, on the basis of the six bits of data input, and then outputs this one bit of data.

In addition, extraction of the five most significant bits of the transmission data from the seven-bit input data by the bit extraction unit 21A in the parity generation unit 12A requires the parity generation unit 12A to output the sixth bit of the transmission data through the bit extraction unit 22A and the LUT 23A. Similarly, extraction of the five most significant bits of the transmission data from the seven-bit input data by the bit extraction unit 21B in the parity generation unit 12B requires the parity generation unit 12B to output the sixth bit of the transmission data through the bit extraction unit 22B and the LUT 23B.

Thus, in the parity generation unit 12A, for example, the LUT 23A outputs the sixth bit of the transmission data as the most significant bit of the three-bit output, generates the most significant bit of the parity data, and outputs this most significant bit of the parity data as the second bit of the three-bit output. Similarly, in the parity generation unit 12B, the LUT 23B outputs the sixth bit of the transmission data as the most significant bit of the three-bit output, generates the least significant bit of the parity data, and outputs this least significant bit of the parity data as the second bit of the three-bit output. The third bit of the output of the LUT 23A and the third bit of the output of the LUT 23B are dummy data.

In this case, the six most significant bits ($B_{00}$, . . . , and $B_{05}$; and $B_{10}$, . . . , and $B_{15}$) of the output of each of the parity generation units 12A and 12B are used to output the transmission data, and the seventh bit ($B_{06}$) of the output of the parity generation unit 12A and the seventh bit ($B_{16}$) of the output of the parity generation unit 12B together constitute the parity data.

The shuffle unit 13 rearranges the six most significant bits ($B_{00}$, . . . , and $B_{05}$) of the output of the parity generation unit 12A, the seventh bit ($B_{06}$) of the output of the parity generation unit 12A, and the seventh bit ($B_{16}$) of the output of the parity generation unit 12B according to the rule of Mode 3 illustrated in FIG. 8, and then outputs the resultant data as the modulation data. Selection of Mode 3 and operation in Mode 3 allow the shuffle unit 13 to generate four bits of modulation data per TS using the transmission data and the parity data output from the parity generation units 12A and 12B.

The mapping units 14A and 14B each map the modulation data input from the shuffle unit 13 to, for example, QPSK constellation points illustrated in FIG. 9, and then outputs coordinate sets of the respective constellation points.

Note that in a case in which three bits of data is sent per TS, the symbol mapping device 1 assigns four bits of the total of six bits of transmission data input to the transmission data processing unit 11 to the first TS, and assigns the remaining two bits of the transmission data and the total of two bits of parity data generated by the parity generation units 12A and 12B to the second TS. However, the manner of the bit assignment is not limited to the arrangement described above. For example, the shuffle unit 13 may be configured to assign three bits of transmission data and one bit of parity data to each of the first TS and the second TS.

Operation for Sending Five Bits of Data Per TS

An operation of the symbol mapping device 1 will next be described of performing multi-dimensional modulation that sends five bits of data per TS.

When five bits of data of an odd-numbered line and five bits of data of an even-numbered line are input to the symbol mapping device 1, the transmission data processing unit 11 selects and operates in Mode 1 illustrated in FIG. 6. In this case, the transmission data processing unit 11 outputs, without change, the five bits of data of the odd-numbered line input and the five bits of data of the even-numbered line input. In this operation, the transmission data processing unit 11 outputs dummy data as the sixth and seventh bits of the data of each of the odd-numbered and even-numbered lines. The transmission data processing unit 11 outputs, for example, '0's as the dummy data.

The bit extraction unit 22A of the parity generation unit 12A extracts, for example, the six most significant bits of data from the seven-bit input data, and then outputs these six bits of data to the LUT 23A. The LUT 23A outputs three bits of parity data for one TS on the basis of the six bits of data input. Similarly, the bit extraction unit 22B of the parity generation unit 12B extract, for example, the six most significant bits of data from the seven-bit input data, and then outputs these six bits of data to the LUT 23B. The LUT 23B outputs three bits of parity data for one TS on the basis of the six bits of data input. Note that the sixth bit of the data input to each of the parity generation units 12A and 12B is dummy data, and therefore, the LUT 23A and the LUT 23B are each configured such that the output thereof does not depend on the sixth bit of the input data. That is, the LUT 23A and the LUT 23B are each configured not to use the sixth bit of the input data in the process of generating the three bits of parity data.

The shuffle unit 13 outputs, without change, the eight bits ($B_{00}, \ldots,$ and $B_{07}$) of the output of the parity generation unit 12A and the eight bits ($B_{10}, \ldots,$ and $B_{17}$) of the output of the parity generation unit 12B according to the rule of Mode 1 illustrated in FIG. 8.

Figure 10:
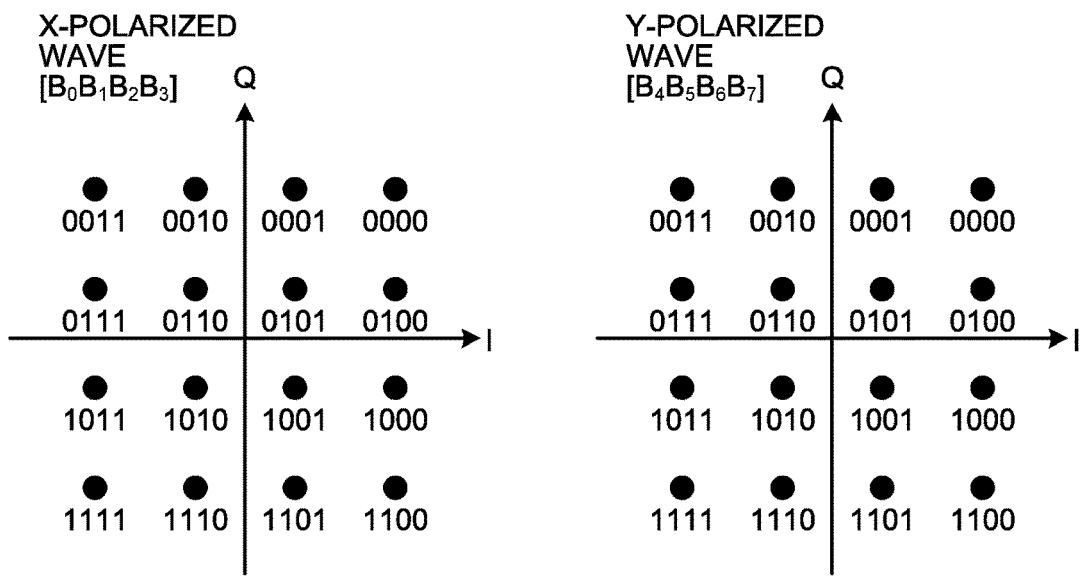
FIG. 10 is a diagram illustrating example relationships between eight-bit modulation data processed by the mapping unit according to the first embodiment, and constellation points.
Figure 11:
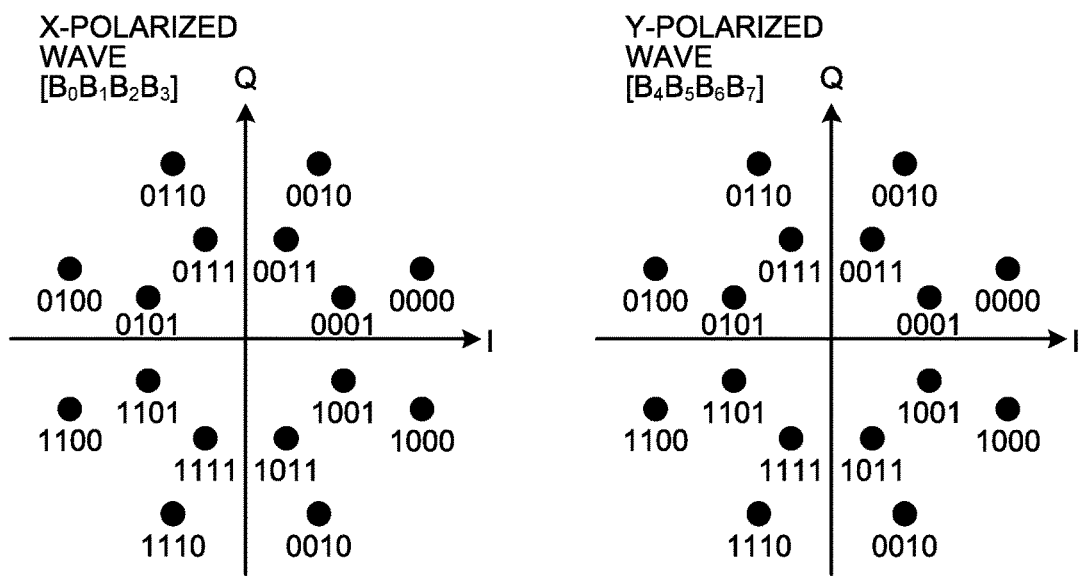
FIG. 11 is a diagram illustrating another set of example relationships between eight-bit modulation data processed by the mapping unit according to the first embodiment, and constellation points.

The mapping units 14A and 14B each map the modulation data input from the shuffle unit 13 to, for example, 16-QAM constellation points illustrated in FIG. 10 or 2A8PSK constellation points illustrated in FIG. 11, and then outputs coordinate sets of the respective constellation points. In the examples illustrated in FIGS. 10 and 11, the mapping unit 14A maps the four most significant bits $B_0, \ldots,$ and $B_3$ to the X-polarized wave of the first TS, and maps the four least significant bits $B_4, \ldots,$ and $B_7$ to the Y-polarized wave. The mapping unit 14B maps the four most significant bits $B_0, \ldots,$ and $B_3$ to the X-polarized wave of the second TS, and maps the four least significant bits $B_4, \ldots,$ and $B_7$ to the Y-polarized wave.

Operation for Sending Six Bits of Data Per TS

An operation of the symbol mapping device 1 will next be described of performing multi-dimensional modulation that sends six bits of data per TS.

When six bits of data of an odd-numbered line and six bits of data of an even-numbered line are input to the symbol mapping device 1, the transmission data processing unit 11 selects and operates in Mode 1 illustrated in FIG. 6. In this case, the transmission data processing unit 11 outputs, without change, the six bits of data of the odd-numbered line input and the six bits of data of the even-numbered line input. In this operation, the transmission data processing unit 11 outputs dummy data as the seventh bit of the data of each of the odd-numbered and even-numbered lines. The transmission data processing unit 11 outputs, for example, '0' as the dummy data.

The bit extraction unit 22A of the parity generation unit 12A extracts the six most significant bits of data, which will be the transmission data for one TS of the odd-numbered line, from the seven-bit input data, and then outputs these six bits of data to the LUT 23A. The LUT 23A generates two bits of parity data for one TS on the basis of the six bits of data input, and then outputs these two bits of data. Similarly, the bit extraction unit 22B of the parity generation unit 12B extracts the six most significant bits of data, which will be the transmission data for one TS of the even-numbered line, from the seven-bit input data, and then outputs these six bits of data to the LUT 23B. The LUT 23B generates two bits of parity data for one TS on the basis of the six bits of data input, and then outputs these two bits of data.

In addition, extraction of the five most significant bits of the transmission data from the seven-bit input data by the bit extraction unit 21A in the parity generation unit 12A requires the parity generation unit 12A to output the sixth bit of the transmission data through the bit extraction unit 22A and the LUT 23A. Similarly, extraction of the five most significant bits of the transmission data from the seven-bit input data by the bit extraction unit 21B in the parity generation unit 12B requires the parity generation unit 12B to output the sixth bit of the transmission data through the bit extraction unit 22B and the LUT 23B.

Thus, in the parity generation unit 12A, for example, the LUT 23A outputs the sixth bit of the transmission data as the most significant bit of the three-bit output, and outputs the parity data using the remaining two bits of the three-bit output. Similarly, in the parity generation unit 12B, the LUT 23B outputs the sixth bit of the transmission data as the most significant bit of the three-bit output, and outputs the parity data using the remaining two bits of the three-bit output.

The shuffle unit 13 outputs, without change, the eight bits ($B_{00}, \ldots,$ and $B_{07}$) of the output of the parity generation unit 12A and the eight bits ($B_{10}, \ldots,$ and $B_{17}$) of the output of the parity generation unit 12B according to the rule of Mode 1 illustrated in FIG. 8.

The mapping units 14A and 14B maps the modulation data input from the shuffle unit 13 to, for example, 16-QAM constellation points illustrated in FIG. 10 or 2A8PSK constellation points illustrated in FIG. 11, and then outputs coordinate sets of the respective constellation points.

Operation for Sending Seven Bits of Data Per TS

An operation of the symbol mapping device 1 will next be described of performing multi-dimensional modulation that sends seven bits of data per TS.

When seven bits of data of an odd-numbered line and seven bits of data of an even-numbered line are input to the symbol mapping device 1, the transmission data processing unit 11 selects and operates in Mode 1 illustrated in FIG. 6. In this case, the transmission data processing unit 11 outputs, without change, the seven bits of data of the odd-numbered line input and the seven bits of data of the even-numbered line input.

The bit extraction unit 22A of the parity generation unit 12A extracts, for example, the six least significant bits of data from the seven-bit input data, and then outputs these six bits of data to the LUT 23A. The LUT 23A outputs one bit of parity data for one TS on the basis of the six bits of data input. Similarly, the bit extraction unit 22B of the parity generation unit 12B extracts, for example, the six least significant bits of data from the seven-bit input data, and then outputs these six bits of data to the LUT 23B. The LUT 23B outputs one bit of parity data for one TS on the basis of the six bits of data input.

In addition, extraction of the five most significant bits of the transmission data from the seven-bit input data by the bit extraction unit 21A in the parity generation unit 12A requires the parity generation unit 12A to output the sixth and seventh bits of the transmission data through the bit extraction unit 22A and the LUT 23A. Similarly, extraction of the five most significant bits of the transmission data from the seven-bit input data by the bit extraction unit 21B in the parity generation unit 12B requires the parity generation unit 12B to output the sixth and seventh bits of the transmission data through the bit extraction unit 22B and the LUT 23B.

Thus, in the parity generation unit 12A, for example, the LUT 23A outputs the sixth and seventh bits of the transmission data using the two most significant bits of the three-bit output, and outputs the parity data using the remaining one bit of the three-bit output. Similarly, in the parity generation unit 12B, the LUT 23B outputs the sixth and seventh bits of the transmission data using the two most significant bits of the three-bit output, and outputs the parity data using the remaining one bit of the three-bit output.

The shuffle unit 13 outputs, without change, the eight bits ($B_{00}, \ldots,$ and $B_{07}$) of the output of the parity generation unit 12A and the eight bits ($B_{10}, \ldots,$ and $B_{17}$) of the output of the parity generation unit 12B according to the rule of Mode 1 illustrated in FIG. 8.

The mapping units 14A and 14B each map the modulation data input from the shuffle unit 13 to, for example, 16-QAM constellation points illustrated in FIG. 10 or 2A8PSK constellation points illustrated in FIG. 11, and then outputs coordinate sets of the respective constellation points.

As described above, the symbol mapping device 1 according to the present embodiment includes the parity generation units 12A and 12B, and the parity generation units 12A and 12B each generate parity data having a size associated with the number of bits of the transmission data per TS using a six-bit input and three-bit output LUT. The symbol mapping device 1 also includes the transmission data processing unit 11 that adjusts the number of bits of the transmission data to be input to each of the parity generation units 12A and 12B to enable the parity generation units 12A and 12B to each use the six-bit input and three-bit output LUT. This configuration provides a symbol mapping device having a set of variable parity generation rules, thereby enabling a reduction in the LUT size. If the symbol mapping device 1 according to the present embodiment is implemented by, for example, an ASIC, a reduction in the LUT size can reduce the circuit size of the ASIC because the LUT will be the main circuit of the ASIC. According to the present embodiment, it is possible to prevent an increase in the circuit size of a symbol mapping device that can provide multiple types of multi-dimensional modulations each providing a different spectral efficiency.

Second Embodiment

Figure 12:
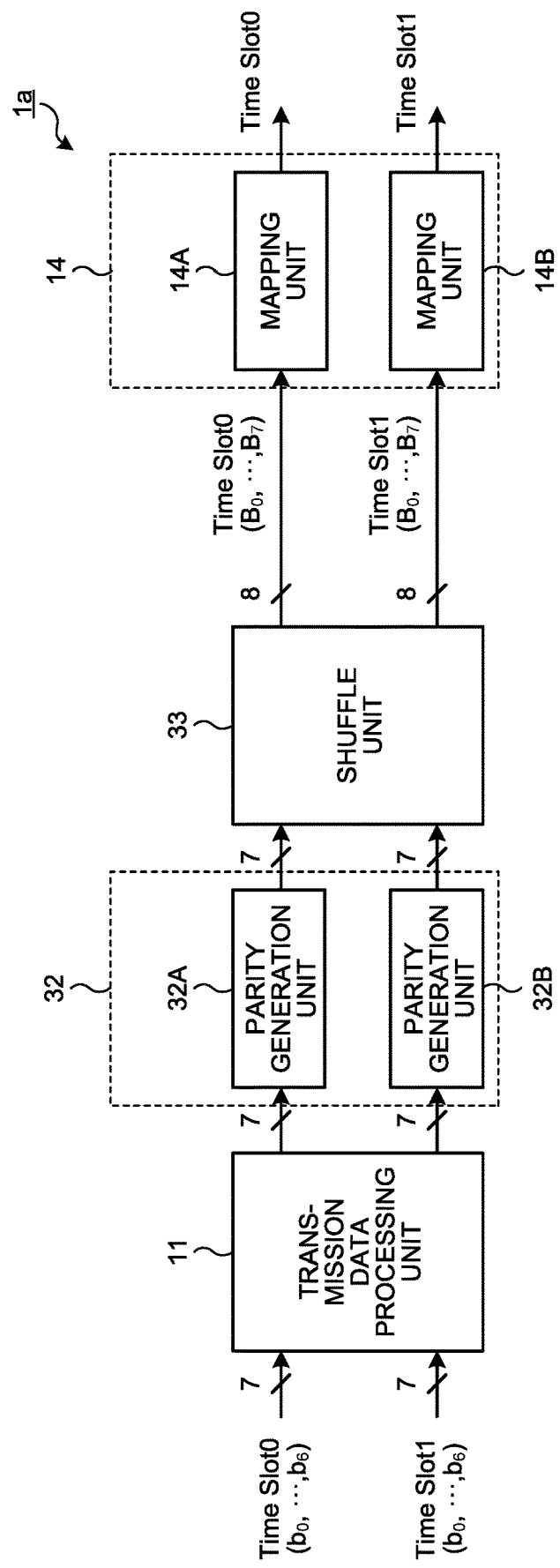
FIG. 12 is a diagram illustrating an example configuration of a symbol mapping device according to a second embodiment.

FIG. 12 is a diagram illustrating an example configuration of a symbol mapping device according to a second embodiment. A symbol mapping device 1a according to the second embodiment is configured such that the parity generation units 12A and 12B of the symbol mapping device 1 described in the first embodiment are replaced by parity generation units 32A and 32B and that the shuffle unit 13 is replaced by a shuffle unit 33. The parity generation units 32A and 32B together form a parity addition unit 32. The present embodiment describes the parity generation units 32A and 32B and the shuffle unit 33 different from the corresponding components of the first embodiment, and a description of the other components will be omitted.

Figure 13:
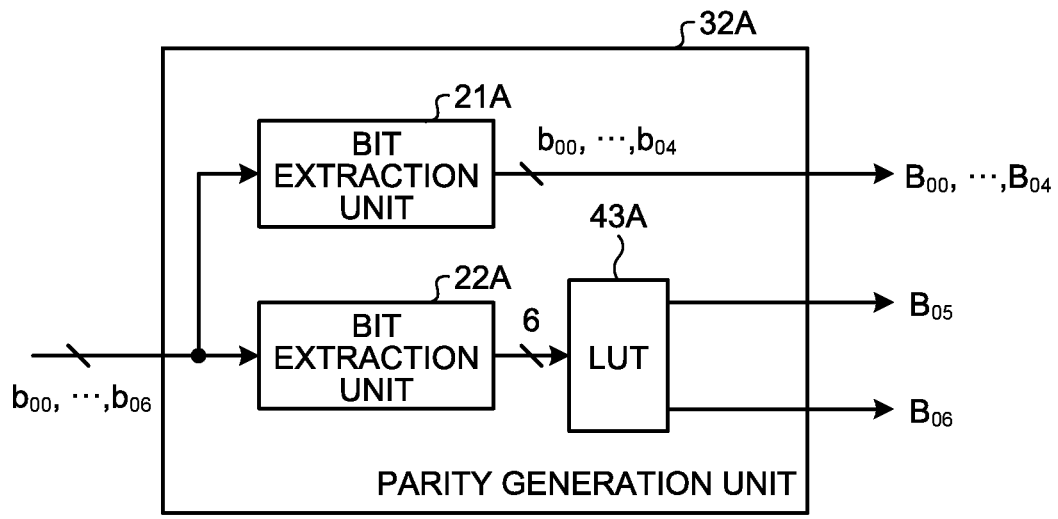
FIG. 13 is a diagram illustrating an example configuration of a first parity generation unit according to the second embodiment.

FIG. 13 is a diagram illustrating an example configuration of the parity generation unit 32A, which is a first parity generation unit of the symbol mapping device 1a according to the second embodiment. The parity generation unit 32A according to the second embodiment includes the bit extraction units 21A and 22A and an LUT 43A. The parity generation unit 32A differs from the parity generation unit 12A described in the first embodiment in including the LUT 43A, and the other components are the same.

Figure 14:
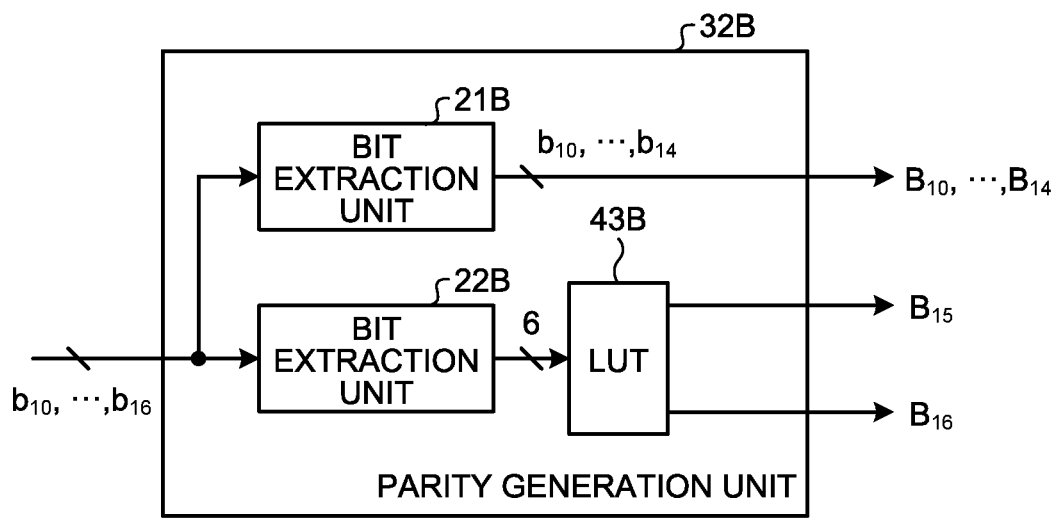
FIG. 14 is a diagram illustrating an example configuration of a second parity generation unit according to the second embodiment.

FIG. 14 is a diagram illustrating an example configuration of the parity generation unit 32B, which is a second parity generation unit of the symbol mapping device 1a according to the second embodiment. The parity generation unit 32B according to the second embodiment includes the bit extraction units 21B and 22B and an LUT 43B. The parity generation unit 32B differs from the parity generation unit 12B described in the first embodiment in including the LUT 43B, and the other components are the same.

The LUTs 23A and 23B described in the first embodiment are each configured to output three bits from a six-bit input. The LUTs 43A and 43B according to the present embodiment differ from the LUTs 23A and 23B in that they are configured to output two bits from a six-bit input. Accordingly, the parity generation units 32A and 32B each output seven bits of parity-added transmission data. Specifically, the parity generation units 32A and 32B each generate and output the seven most significant bits that result from discarding the least significant bit from the eight bits of the data output by the parity generation units 12A and 12B described in the first embodiment. The parity generation units 32A and 32B each generate the seven-bit output data similarly to the parity generation units 12A and 12B that generate the seven most significant bits of the output data. It is assumed herein that the configuration, i.e., the processing to be performed, of each of the LUTs 43A and 43B is rewritable from outside the symbol mapping device 1a.

The shuffle unit 33 generates a total of 16 bits of modulation data on the basis of a total of 14 bits of parity-added transmission data input from the LUTs 43A and 43B.

Figures 15, 16:
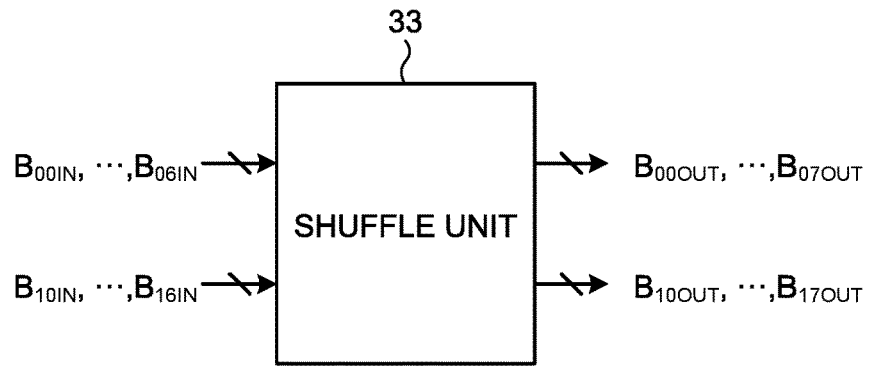
FIG. 15 is a diagram illustrating definitions of input signals and output signals to and from a shuffle unit according to the second embodiment.
FIG. 16 is a diagram illustrating an example of shuffling process performed by the shuffle unit according to the second embodiment.

FIG. 15 is a diagram illustrating definitions of input signals to the shuffle unit 33 and of output signals of the shuffle unit 33. FIG. 16 is a diagram illustrating an example of shuffling process performed by the shuffle unit 33. Similarly to the first embodiment, Mode 1 is an operation mode selected by the shuffle unit 33 in a case in which data having a length of five to seven bits is to be sent in one TS. Mode 2 is an operation mode selected by the shuffle unit 33 in a case in which data having a length of two bits is to be sent in one TS. Mode 3 is an operation mode selected by the shuffle unit 33 in a case in which data having a length of three bits is to be sent in one TS.

The shuffle unit 33 receives parity-added transmission data $B_{00IN}, \ldots,$ and $B_{06IN},$ and $B_{10IN}, \ldots,$ and $B_{16IN}$ from the parity generation units 32A and 32B. The bits $B_{00IN}, \ldots,$ and $B_{06IN}$ respectively correspond to the bits $B_{00}, \ldots,$ and $B_{06}$ illustrated in FIG. 13, and the bits $B_{10IN}, \ldots,$ and $B_{16IN}$ respectively correspond to the bits $B_{10}, \ldots,$ and $B_{16}$ illustrated in FIG. 14. In Mode 2 and Mode 3, the shuffle unit 33 outputs the same data as the data output by the shuffle unit 13 described in the first embodiment in Mode 2 and in Mode 3. In FIG. 16, the symbol '~' represents logical inversion. Note that the bits $B_{00OUT}, \ldots,$ and $B_{07OUT}$ illustrated in FIG. 15 respectively correspond to the bits $B_0, \ldots,$ and $B_7$ of TS0 (Time Slot 0) illustrated in FIG. 12, and the bits $B_{10OUT}, \ldots,$ and $B_{17OUT}$ illustrated in FIG. 15 respectively correspond to the bits $B_0, \ldots,$ and $B_7$ of TS1 (Time Slot 1) illustrated in FIG. 12.

Similarly to the shuffle unit 13 described in the first embodiment, the shuffle unit 33 also has three operation modes, and operates in a mode associated with the number of bits of data to be sent in one TS. It is assumed here that the input data per TS to the shuffle unit 33 has a bit width of seven bits and the output data per TS has a bit width of eight bits. In a case in which the number of bits of data to be sent in one TS is less than eight bits, the shuffle unit 33 stores the modulation data in the most significant bit positions. The remaining bit position(s) is or are filled with, for example, '0' or '0's, or given data as the dummy data.

A symbol mapping operation performed by the symbol mapping device 1a according to the second embodiment will next be described. Similarly to the first embodiment, the operation of the symbol mapping device 1a will be described below individually according to the number of bits of the data to be sent per TS.

Operation for Sending Two Bits or Three Bits of Data Per TS

First, an operation of the symbol mapping device 1a will be described of performing multi-dimensional modulation that sends two bits or three bits of data per TS.

In a case of sending two bits or three bits of data per TS, the symbol mapping device 1a operates differently from the symbol mapping device 1 described in the first embodiment that sends two bits or three bits of data per TS, in not outputting the dummy data in the least significant bit position of the data input from each of the parity generation units 32A and 32B to the shuffle unit 33. Other operations of the symbol mapping device 1a are the same as those of the symbol mapping device 1. That is, in a case of sending two bits or three bits of data per TS, the LUTs 23A and 23B of the respective parity generation units 12A and 12B described in the first embodiment each output dummy data in the third bit position of the three-bit output, while the LUTs 43A and 43B of the respective parity generation units 32A and 32B do not output the dummy data in the third bit position described above.

Operation for Sending Five Bits of Data Per TS

An operation of the symbol mapping device 1a will next be described of performing multi-dimensional modulation that sends five bits of data per TS.

In a case of multi-dimensional modulation that sends five-bit data per TS, the LUTs 43A and 43B in the symbol mapping device 1a each output two bits of parity data on the basis of the six bits of data input. Note that the sixth bit of the data input to each of the LUTs 43A and 43B is dummy data, and therefore, the LUT 43A and the LUT 43B are each configured such that the output thereof does not depend on the sixth bit of the input data.

Sending of five-bit data per TS requires three bits of parity data per TS, but the parity generation units 32A and 32B each output only two bits of parity data. Thus, the shuffle unit 33 outputs parity data generated by logical inversion of the seventh bit of the data input, as the eighth bit of the modulation data as illustrated in FIGS. 15 and 16.

Operation for Sending Six Bits of Data Per TS

An operation of the symbol mapping device 1a will next be described of performing multi-dimensional modulation that sends six bits of data per TS.

In a case of multi-dimensional modulation that sends six bits of data per TS, the LUTs 43A and 43B in the symbol mapping device 1a each output one bit of parity data on the basis of the six bits of data input. That is, the LUTs 43A and 43B each output the sixth bit of the transmission data using the first bit of the two-bit output, and output the parity data using the second bit of the two-bit output.

Sending of six-bit data per TS requires two bits of parity data per TS, but the parity generation units 32A and 32B each output only one bit of parity data. Thus, the shuffle unit 33 outputs parity data generated by logical inversion of the seventh bit of the data input, as the eighth bit of the modulation data as illustrated in FIGS. 15 and 16.

Operation for Sending Seven Bits of Data Per TS

An operation of the symbol mapping device 1a will next be described of performing multi-dimensional modulation that sends seven bits of data per TS.

In a case of multi-dimensional modulation that sends seven bits of data per TS, the LUTs 43A and 43B in the symbol mapping device 1a each output the sixth bit of the transmission data using the first bit of the two-bit output, and output the seventh bit of the transmission data using the second bit of the two-bit output.

Sending of seven-bit data per TS requires one bit of parity data per TS, but no parity data is output from the parity generation units 32A and 32B. Thus, the shuffle unit 33 outputs parity data generated by logical inversion of the seventh bit of the data input, as the eighth bit of the modulation data as illustrated in FIGS. 15 and 16.

As described above, the symbol mapping device 1a according to the present embodiment includes the parity generation units 32A and 32B, and the parity generation units 32A and 32B each generate parity data having a length up to two bits depending on the number of bits of the transmission data per TS, using a six-bit input and two-bit output LUT. In addition, in a case in which the parity generation units 32A and 32B are not capable of generating the necessary parity data, the shuffle unit 33 generates the parity data and adds the parity data to the transmission data. This can further reduce the circuit size of an LUT as compared to the circuit size thereof in the first embodiment.

A hardware configuration of the symbol mapping devices 1 and 1a described in the first and second embodiments will next be described. The transmission data processing unit, the parity generation units, the shuffle unit, and the mapping units included in the symbol mapping devices 1 and 1a are implemented in a processing circuit. That is, the symbol mapping devices 1 and 1a each include a processing circuit for converting transmission data to constellation point coordinate sets. The processing circuit may be a dedicated hardware element, or may be a control circuit including a processor and a memory.

Figure 17:
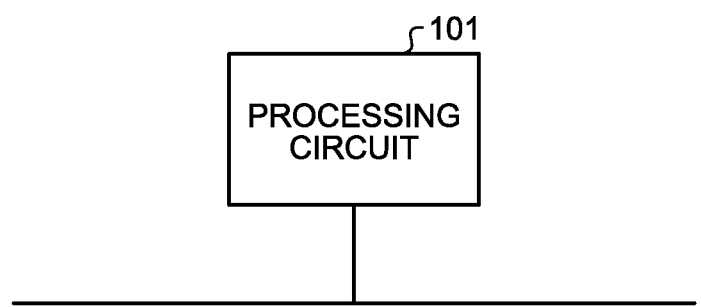
FIG. 17 is a diagram illustrating an example configuration of hardware in a case in which components of the symbol mapping device according to the first and second embodiments are implemented in a dedicated hardware element.

FIG. 17 is a diagram illustrating an example configuration of hardware in a case in which components of each of the symbol mapping devices 1 and 1a are implemented in a dedicated hardware element. In a case in which the transmission data processing unit, the parity generation units, the shuffle unit, and the mapping units of each of the symbol mapping devices 1 and 1a are implemented in a dedicated hardware element, a processing circuit 101, which is the dedicated hardware element, is, for example, a single circuit, a composite circuit, a programmed processor, a parallel programmed processor, an ASIC, a field programmable gate array (FPGA), or a combination thereof. The transmission data processing unit, the parity generation units, the shuffle unit, and the mapping units may be implemented in a combination of multiple processing circuits, or the functionality of these components may be collectively implemented in a single processing circuit.

Figure 18:
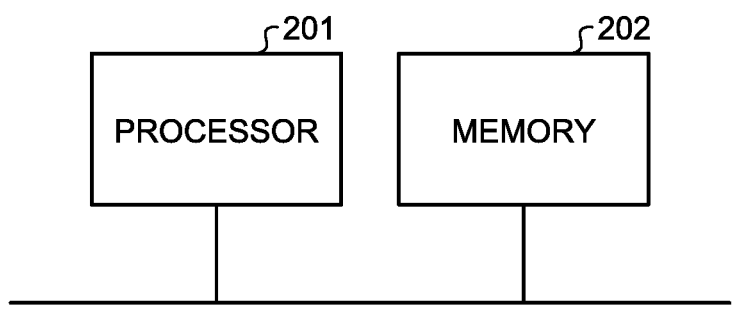
FIG. 18 is a diagram illustrating an example configuration of hardware in a case in which components of the symbol mapping device according to the first and second embodiments are implemented in a control circuit.

FIG. 18 is a diagram illustrating an example configuration of hardware in a case in which components of each of the symbol mapping devices 1 and 1a are implemented in a control circuit. In a case in which the symbol mapping devices 1 and 1a are implemented in a control circuit, the control circuit includes a processor 201 and a memory 202. The processor 201 is a central processing unit (CPU) (also referred to as central processing unit, processing circuit, computing unit, microprocessor, microcomputer, or digital signal processor (DSP)), a system large scale integration (LSI), or the like. The memory 202 is generally a non-volatile or volatile semiconductor memory such as a random access memory (RAM), a read-only memory (ROM), a flash memory, an erasable programmable read-only memory (EPROM), or an electrically erasable programmable read-only memory (EEPROM), but may also be a magnetic disk, a flexible disk, an optical disk, a compact disc, a MiniDisc, a digital versatile disc (DVD), or the like.

In a case in which the transmission data processing unit, the parity generation units, the shuffle unit, and the mapping units of each of the symbol mapping devices 1 and 1a are implemented in a control circuit, the functionality of these components is implemented in software, firmware, or a combination of software and firmware. The software or firmware is described as a program, and is stored in the memory 202. The processor 201 reads and executes a program stored in the memory 202 to implement the functionality of the components of the symbol mapping devices 1 and 1a. That is, the symbol mapping devices 1 and 1a each include the memory 202 for storing a program that, upon execution by the control circuit, causes the step of adjusting the transmission data length, the step of generating parity data, the step of rearranging the bits of the modulation data, and the step of assigning the modulation data to constellation point coordinate sets, to be performed. It can also be said that this program causes a computer to perform methods or procedures of the transmission data processing unit, the parity generation units, the shuffle unit, and the mapping units.

Note that the transmission data processing unit, the parity generation units, the shuffle unit, and the mapping units may be implemented partially in a dedicated hardware element, and partially in software or firmware. For example, a configuration may be used in which the functionality of the parity generation units is implemented in a processing circuit serving as a dedicated hardware element, while the functionality of the transmission data processing unit, the shuffle unit, and the mapping units is implemented in a processor that reads and executes a program stored in a memory. As described in the embodiments, implementation of the parity generation units in a dedicated hardware element can reduce the circuit size. Moreover, implementation of the parity generation units in software or firmware can reduce the processing load.

As described above, the processing circuit enables the functionality of the symbol mapping devices 1 and 1a to be implemented in hardware, software, firmware, or a combination thereof.

The configurations described in the foregoing embodiments are merely examples of various aspects of the present invention. These configurations may be combined with a known other technology, and moreover, part of such configurations may be omitted and/or modified without departing from the spirit of the present invention.

REFERENCE SIGNS LIST 1, 1a symbol mapping device; 11 transmission data processing unit; 12, 32 parity addition unit; 12A, 12B, 32A, 32B parity generation unit; 13, 33 shuffle unit; 14 mapping processing unit; 14A, 14B mapping unit; 21A, 21B, 22A, 22B bit extraction unit; 23A, 23B, 43A, 43B look-up table (LUT).

The invention claimed is:
1. A symbol mapping device comprising:
a transmission data processor to receive two pieces of transmission data having a same length, and in a case in which the length is a first length, to use the two pieces of transmission data as two pieces of output data without change, and in a case in which the length is less than the first length, to add dummy data to the two pieces of transmission data to generate two pieces of output data, each piece having the first length;
a parity adder to generate two pieces of parity-added transmission data on a basis of the two pieces of output data, the two pieces of parity-added transmission data each containing parity data added to the transmission data and each having a second length;
a modulation data extractor to extract two pieces of modulation data, being data to be mapped, from the two pieces of parity-added transmission data generated by the parity adder; and
a mapping processor to map the two pieces of modulation data to two time slots of constellation points, wherein the parity adder includes
a first parity generator to generate one of the two pieces of parity-added transmission data on a basis of one of the two pieces of output data, and a second parity generator to generate another one of the two pieces of parity-added transmission data on a basis of another one of the two pieces of output data, and the first parity generator and the second parity generator each include a first bit extractor to extract a first number of bits of data from the output data, the first number being less than a number of bits of the output data, and to output the first number of bits of data as a portion of data of the parity-added transmission data having the second length, a second bit extractor to extract a second number of bits of data from the output data, the second number being less than the number of bits of the output data, and a look-up table circuit to generate remaining data other than the portion of data, of the parity-added transmission data having the second length, on a basis of the second number of bits of data.

2. The symbol mapping device according to claim 1, wherein a configuration of the look-up table circuit is rewritable externally.

3. The symbol mapping device according to claim 1, wherein in a case in which the first length is equal to the second length and the output data is the transmission data having the first length, the modulation data extractor extracts the two pieces of modulation data, and then further generates parity data on a basis of the two pieces of modulation data, and adds the generated parity data to the two pieces of modulation data.

4. The symbol mapping device according to claim 2, wherein in a case in which the first length is equal to the second length and the output data is the transmission data having the first length, the modulation data extractor extracts the two pieces of modulation data, and then further generates parity data on a basis of the two pieces of modulation data, and adds the generated parity data to the two pieces of modulation data.

5. A symbol mapping device comprising:

a transmission data processor to receive two pieces of transmission data having a same length, and in a case in which the length is a first length, to use the two pieces of transmission data as two pieces of output data without change, and in a case in which the length is less than the first length, to add dummy data to the two pieces of transmission data to generate two pieces of output data, each piece having the first length;

a parity adder to generate two pieces of parity-added transmission data on a basis of the two pieces of output data, the two pieces of parity-added transmission data each containing parity data added to the transmission data and each having a second length;

a modulation data extractor to extract two pieces of modulation data, being data to be mapped, from the two pieces of parity-added transmission data generated by the parity adder; and a mapping processor to map the two pieces of modulation data to two time slots of constellation points, wherein in a case in which the first length is equal to the second length and the output data is the transmission data having the first length, the modulation data extractor extracts the two pieces of modulation data, and then further generates parity data on a basis of the two pieces of modulation data, and adds the generated parity data to the two pieces of modulation data.

* * * * *